United States Patent
Klee et al.

(10) Patent No.: US 12,366,608 B2
(45) Date of Patent: Jul. 22, 2025

(54) METHOD FOR DETECTING ELECTRICAL FAULT STATES OF A REMOVABLE BATTERY PACK AND/OR AN ELECTRICAL DEVICE THAT CAN BE CONNECTED TO THE REMOVABLE BATTERY PACK, AND SYSTEM FOR CARRYING OUT THE METHOD

(71) Applicant: Robert Bosch GmbH, Stuttgart (DE)

(72) Inventors: Christoph Klee, Stuttgart (DE); Holger Wernerus, Filderstadt (DE); Marc-Alexandre Seibert, Stuttgart (DE); Tim Brecht, Karlsbad (DE)

(73) Assignee: Robert Bosch GmbH, Stuttgart (DE)

( * ) Notice: Subject to any disclaimer, the term of this patent is extended or adjusted under 35 U.S.C. 154(b) by 842 days.

(21) Appl. No.: 17/381,490

(22) Filed: Jul. 21, 2021

(65) Prior Publication Data
US 2022/0026493 A1    Jan. 27, 2022

(30) Foreign Application Priority Data
Jul. 24, 2020    (DE) ..................... 10 2020 209 398.9

(51) Int. Cl.
*G01R 31/3832*    (2019.01)
*G01R 31/36*    (2020.01)
(Continued)

(52) U.S. Cl.
CPC ..... *G01R 31/3832* (2019.01); *G01R 31/3648* (2013.01); *H01M 10/48* (2013.01);
(Continued)

(58) Field of Classification Search
CPC .......... H01M 10/4257; H01M 10/448; H01M 10/48; H01M 10/4285; H01M 10/4221;
(Continued)

(56) References Cited

U.S. PATENT DOCUMENTS 5,444,378 A * 8/1995 Rogers ............... G01R 31/3832
320/136
5,825,155 A * 10/1998 Ito ......................... H02J 7/0013
429/149

(Continued)

FOREIGN PATENT DOCUMENTS

DE    10 2016 209 822 A1    12/2017
DE    10 2019 135 500 A1    7/2020
WO    2020/043386 A1    3/2020

*Primary Examiner* — John T Trischler
(74) *Attorney, Agent, or Firm* — Maginot, Moore & Beck LLP

(57) ABSTRACT

A method detects electrical fault states of a removable battery pack and/or an electrical device, in particular a charging device, a diagnostic device or an electrical consumer, that can be connected to the removable battery pack, using a first monitoring unit integrated in the removable battery pack. The method includes measuring a charging or discharge current using a first current measuring apparatus integrated in the electrical device and transmitting the measured current directly or as a converted voltage value to the first monitoring unit of the removable battery pack, and determining, using the first monitoring unit, based on the charging or discharge current and/or the voltage value calculated therefrom, whether the removable battery pack is operating in a permissible operating range.

14 Claims, 4 Drawing Sheets

(51) Int. Cl.
*H01M 10/48* (2006.01)
*H02J 7/00* (2006.01)
*H01M 10/42* (2006.01)

(52) U.S. Cl.
CPC ...... *H02J 7/00304* (2020.01); *H02J 7/00714* (2020.01); *H02J 7/00716* (2020.01); *H02J 7/00718* (2020.01); H01M 10/4257 (2013.01); H01M 10/4285 (2013.01)

(58) Field of Classification Search
CPC ............... H01M 50/247; H02J 7/00306; H02J 7/00302; H02J 7/00308; H02J 7/00304; H02J 7/0049; H02J 7/0048; H02J 7/00716; H02J 7/00714; H02J 7/00718; H02J 7/00047; H02J 7/00038; G01R 31/3647; G01R 31/3832; G01R 31/3648; G01R 31/3646; G01R 31/378; G01R 31/00; G01R 31/385; G01R 31/396; G01R 31/52; Y02E 60/10
USPC .................................. 324/426–434; 320/132
See application file for complete search history.

(56) References Cited

U.S. PATENT DOCUMENTS

| | | | | |
|---|---|---|---|---|
| 6,856,922 B1* | 2/2005 | Austin | .................. | H02J 7/0071 702/65 |
| 6,897,635 B2* | 5/2005 | Ozawa | .................. | H02J 7/0048 320/127 |
| 6,930,467 B2* | 8/2005 | Suzuki | .................. | H01M 10/425 320/134 |
| 8,080,979 B2* | 12/2011 | Abe | .................. | H02J 7/04 320/152 |
| 8,148,939 B2* | 4/2012 | Kitagawa | .................. | H01M 10/46 320/112 |
| 9,091,737 B2* | 7/2015 | Tzivanopoulos | ... | H01M 10/482 |
| 9,124,107 B2* | 9/2015 | Abe | .................. | H01M 10/443 |
| 9,459,324 B2* | 10/2016 | Boehm | .................. | G01R 31/3842 |
| 9,466,990 B2* | 10/2016 | Boehm | .................. | H02J 7/00308 |
| 9,869,724 B2* | 1/2018 | Kimura | .................. | G01R 31/3835 |
| 10,511,180 B2* | 12/2019 | Oikarinen | .................. | H02J 7/0044 |
| 10,516,275 B2* | 12/2019 | Klee | .................. | H01M 10/46 |
| 10,651,515 B2* | 5/2020 | Henrici | .................. | H04Q 9/00 |
| 10,725,110 B2* | 7/2020 | Dan | .................. | G01R 15/146 |
| 10,823,784 B2* | 11/2020 | Dan | .................. | G01R 15/146 |
| 11,258,281 B2* | 2/2022 | Tan | .................. | H02J 7/04 |
| 11,415,633 B2* | 8/2022 | Lee | .................. | G01R 19/165 |
| 11,476,790 B2* | 10/2022 | Ichikawa | .................. | A01G 3/053 |
| 11,774,470 B2* | 10/2023 | Zhang | .................. | G01R 27/16 324/705 |
| 11,777,329 B2* | 10/2023 | Osswald | .................. | H02J 7/00712 320/112 |
| 11,894,710 B2* | 2/2024 | Uesugi | .................. | H02J 7/007182 |
| 11,984,743 B2* | 5/2024 | Klee | .................. | H01M 10/48 |
| 12,126,202 B2* | 10/2024 | Osswald | .................. | G01R 31/3835 |
| 12,184,112 B2* | 12/2024 | Hori | .................. | H01M 10/46 |
| 2003/0193318 A1* | 10/2003 | Ozawa | .................. | H02J 7/0048 320/132 |
| 2004/0101744 A1* | 5/2004 | Suzuki | .................. | H01M 10/4207 429/61 |
| 2009/0039833 A1* | 2/2009 | Kitagawa | .................. | H01M 10/48 320/134 |
| 2009/0124298 A1* | 5/2009 | Suzuki | .................. | H04W 52/0283 455/572 |
| 2009/0167252 A1 | 7/2009 | Abe | | |
| 2011/0112782 A1* | 5/2011 | Majima | .................. | H01M 10/48 324/427 |
| 2012/0019200 A1* | 1/2012 | Abe | .................. | H01M 10/443 320/107 |
| 2012/0282500 A1* | 11/2012 | Tzivanopoulos | ... | H01M 10/482 429/61 |
| 2013/0257444 A1* | 10/2013 | Boehm | .................. | G01R 31/3842 324/434 |
| 2014/0021926 A1* | 1/2014 | Boehm | .................. | H02J 7/00308 320/134 |
| 2015/0010790 A1* | 1/2015 | Henrici | .................. | H01M 10/425 429/50 |
| 2015/0032394 A1* | 1/2015 | Kimura | .................. | G01R 31/367 702/63 |
| 2015/0357853 A1* | 12/2015 | Suzuki | .................. | H02P 29/00 318/139 |
| 2016/0118840 A1* | 4/2016 | Shinoda | .................. | H01M 10/46 320/108 |
| 2017/0353041 A1* | 12/2017 | Klee | .................. | B25F 5/02 |
| 2018/0175641 A1* | 6/2018 | Oikarinen | .................. | H02J 7/0044 |
| 2019/0120906 A1* | 4/2019 | Dan | .................. | G01R 19/0092 |
| 2020/0067327 A1* | 2/2020 | Oikarinen | .................. | H01M 10/44 |
| 2020/0212837 A1* | 7/2020 | Ichikawa | .................. | A01G 3/062 |
| 2020/0300917 A1* | 9/2020 | Dan | .................. | G01R 15/146 |
| 2020/0386823 A1* | 12/2020 | Lee | .................. | G01R 35/00 |
| 2021/0006081 A1* | 1/2021 | Tan | .................. | H02J 7/007182 |
| 2021/0021144 A1* | 1/2021 | Geng | .................. | H01M 10/441 |
| 2021/0075243 A1* | 3/2021 | Uesugi | .................. | H01M 10/425 |
| 2021/0296918 A1* | 9/2021 | Klee | .................. | G01R 31/3835 |
| 2022/0029433 A1* | 1/2022 | Osswald | .................. | G01K 7/24 |
| 2022/0029436 A1* | 1/2022 | Osswald | .................. | H02J 7/0029 |
| 2022/0029437 A1* | 1/2022 | Osswald | .................. | H02J 7/0047 |
| 2022/0074977 A1* | 3/2022 | Zhang | .................. | G01R 27/02 |
| 2022/0190620 A1* | 6/2022 | Hori | .................. | H02J 7/00036 |
| 2023/0173924 A1* | 6/2023 | Yamaguchi | .................. | H01M 10/44 320/162 |

* cited by examiner

METHOD FOR DETECTING ELECTRICAL FAULT STATES OF A REMOVABLE BATTERY PACK AND/OR AN ELECTRICAL DEVICE THAT CAN BE CONNECTED TO THE REMOVABLE BATTERY PACK, AND SYSTEM FOR CARRYING OUT THE METHOD

This application claims priority under 35 U.S.C. § 119 to patent application no. DE 10 2020 209 398.9, filed on Jul. 24, 2020 in Germany, the disclosure of which is incorporated herein by reference in its entirety.

The disclosure relates to a method for detecting electrical fault states of a removable battery pack and/or an electrical device, in particular a charging device, a diagnostic device or an electrical consumer, that can be connected to the removable battery pack, by means of a first monitoring unit integrated in the removable battery pack. The disclosure further relates to a system for carrying out the method.

BACKGROUND

A multiplicity of electrical consumers are operated using battery packs that can be removed without tools by the operator—referred to as removable battery packs in the following text—and that are discharged accordingly by the electrical consumer and can be recharged again by means of a charging device. Such removable battery packs usually consist of a plurality of energy storage cells interconnected in series and/or in parallel for achieving a requested removable battery pack voltage or capacity. If the energy storage cells are designed as lithium-ion cells (Li-ion), for example, a high power and energy density can particularly advantageously be achieved. On the other hand, to prevent electrical fault states, such cells also require compliance with strict specifications regarding the maximum charging and discharge current, the voltage and the temperature.

In modern removable battery packs, the cell voltage of the parallel-connected energy storage cells of what is known as a cell cluster is evaluated, for example, by a monitoring unit integrated in the removable battery pack. The term "cell voltage" should accordingly be understood not only as the voltage of an individual energy storage cell but also that of a cell cluster consisting of parallel-interconnected energy storage cells. So-called single cell monitoring (SCM) of this type is known, for example, from WO 20043386 A1, in which dangerous operation of the removable battery pack in the event of a fault is precluded by redundant monitoring.

In order for a charging device or an electrical consumer to know with which charging or discharge current a removable battery pack may be operated at a maximum, this is generally communicated by electrical coding, for example by coding resistors integrated in the removable battery pack that are measured by the electrical device and compared with a stored table, mechanical coding or a communication interface. DE 10 2016 209 822 A1 likewise discloses that the electrical device communicates to the removable battery pack that it may not continue to be used. The cell voltages can also be transmitted to the device via such an interface.

In battery packs in which the expected charging currents are a lot lower than the discharge currents, the measuring systems are generally stretched to their limits. A typical measuring apparatus is, for example, a so-called shunt, that is to say a resistor with a relatively low defined resistance value, in the current path. The resistance value must on the one hand be so low that it does not generate any dangerous heat in nominal operation; on the other hand, the voltage dropped across the shunt due to the charging or discharge current must be high enough for precise measurement. A shunt of this type must accordingly be very low-impedance for high currents in order not to produce any heat, but, in particular at a low charging current generates a very low voltage drop, which can be measured relatively inaccurately. Although a switchover between various shunts would be conceivable, it requires switching elements in the removable battery pack, which for their part again cause undesired losses.

Proceeding from the prior art, it is the object of the disclosure to precisely identify any fault states in a removable battery pack and/or electrical device that can be connected thereto both for high as well as for low charging or discharge currents for safe operation and to control the charging or discharging process depending thereon.

SUMMARY

Provision is made according to the disclosure for a charging or discharge current to be measured by means of a first current measuring apparatus integrated in the electrical device and to be transmitted directly or as a converted voltage value to the first monitoring unit of the removable battery pack and for the first monitoring unit to determine, based on a charging or discharge current and/or voltage value calculated therefrom, whether the removable battery pack is operating in a permissible operating range. Particularly for the case that the electrical device is designed as a charging device, the particular advantage of transferring a current measuring apparatus into the charging device consists in that said current measuring apparatus does not have to be able to carry a very high discharge current but only a relatively low charging current.

A current measuring apparatus in the removable battery pack that must be able to carry discharge currents of up to 250 A would thus be significantly more complex than a current measuring apparatus in the charging device in which charging currents of only approximately 16 A or lower arise. However, even in the case of an electrical consumer or diagnostic device, the transferred current measuring apparatus can be better adapted to the respective discharge current, with the result that the disadvantages of a current measuring apparatus integrated in the removable battery pack described at the beginning can be prevented effectively.

In the context of the disclosure, electrical consumers should be understood to mean, for example, power tools operated using a removable battery pack for performing work on workpieces by means of an electrically driven insert tool. The power tool may in this case be designed both as a hand-held power tool and as a floor-standing power tool. Typical power tools in this context are hand-held or floor-standing drills, screwdrivers, impact drills, hammer drills, planers, angle grinders, orbital sanders, polishing machines, circular, bench, miter and jig saws or the like. However, gardening appliances operated using a removable battery pack such as lawn mowers, lawn trimmers, pruning saws or the like and also domestic appliances operated using a removable battery pack such as vacuum cleaners, mixers, etc., may also be included under the term electrical consumer. The disclosure can likewise be applied to electrical consumers that are supplied with power using a plurality of removable battery packs at the same time.

The voltage of a removable battery pack is generally a multiple of the voltage of an individual energy storage cell and results from the interconnection (in parallel or in series) of the individual energy storage cells. An energy storage cell is typically designed as a galvanic cell, which has a structure in which one cell pole comes to lie at one end and a further cell pole comes to lie at an opposite end. In particular, the energy storage cell at one end has a positive cell pole and at an opposite end a negative cell pole. The energy storage cells are preferably designed as lithium-based energy storage cells, for example Li-ion, Li-Po, Li-metal and the like. However, the disclosure can also be applied to removable battery packs with Ni—Cd, Ni-MH cells or other suitable cell types. In current Li-ion energy storage cells with a cell voltage of 3.6 V, for example voltage classes of 3.6 V, 7.2 V, 10.8 V, 14.4 V, 18 V, 36 V etc. are produced. An energy storage cell is preferably designed as an at least substantially cylindrical round cell, wherein the cell poles are arranged at ends of the cylinder shape. However, the disclosure is not dependent on the type and construction of the energy storage cells used but can be applied to any removable battery packs and energy storage cells, for example also pouch cells or the like in addition to round cells.

It should furthermore be noted that the configuration of the electromechanical interfaces of the removable battery packs and the electrical devices that can be connected thereto and also the associated receptacles for force-fitting and/or form-fitting releasable connection are not intended to be the subject of this disclosure. A person skilled in the art will select a suitable embodiment for the interface depending on the power or voltage class of the electrical device and/or the removable battery pack. The embodiments shown in the drawings are therefore to be understood as purely exemplary. It is thus possible, in particular, to also use interfaces having more than the illustrated electrical contacts.

In another configuration of the method according to the disclosure, provision is made for the charging or discharge current calculated by the first monitoring unit to be transmitted to the further monitoring unit of the electrical device and for the charging or discharge current to be measured by means of a second current measuring apparatus of the electrical device and to be compared by the further monitoring unit of the electrical device with the charging or discharge current calculated by the first monitoring unit. A simple and effective plausibility check can be carried out in the electrical device in this way. The second current measuring apparatus of the electrical device can in this case advantageously be configured in a manner analogous to the first current measuring apparatus.

At least one impermissible voltage range and at least one permissible voltage range for the measured charging or discharge current is defined for the first current measuring apparatus of the electrical device, wherein a linear, non-linear or discontinuous current-voltage transmission function is provided in the at least one permissible voltage range. The current-voltage transmission function is advantageously known to the first monitoring unit of the removable battery pack so that said monitoring unit can very simply and quickly carry out a corresponding plausibility check for the permissible operating range. In addition, the first monitoring unit in the removable battery pack can immediately evaluate whether an electrical device that does not have a corresponding current measuring apparatus is being used.

In another configuration, provision is made for the first monitoring unit to be able to adjust an amplifier circuit of the removable battery pack to amplify the measured charging or discharge current or the voltage value derived therefrom in such a way that, in the event of a voltage value outside of its measurement range, a voltage value within the measurement range is produced.

Since the first monitoring unit itself has knowledge about this switchover, it can advantageously interpret and evaluate the now lower measured voltage as an actually higher voltage.

The further monitoring unit of the electrical device terminates the charging or discharging process or reduces it and/or signals a fault state of the removable battery pack when the calculated and the measured charging or discharge current deviate from one another by a defined difference value, for example by more than 0.5 A.

The disclosure also relates to a system comprising a removable battery pack having a first monitoring unit and a first electromechanical interface having a plurality of electrical contacts, and also an electrical device, in particular a charging device, a diagnostic device or an electrical consumer, having a further monitoring unit, a first current measuring apparatus and a further electromechanical interface having a plurality of electrical contacts, wherein in each case a first of the electrical contacts of the interfaces is designed as an energy supply contact that can be supplied with a first reference potential, preferably a supply potential, in each case a second of the electrical contacts of the interfaces is designed as an energy supply contact that can be supplied with a second reference potential, preferably a ground potential, and in each case a third of the electrical contacts of the interfaces is designed as a signal or data contact for transmitting a charging or discharge current measured by means of the first current measuring apparatus of the electrical device or a voltage value derived therefrom to the first monitoring unit of the removable battery pack, and wherein the electrical contacts of the first and the further interface can be connected to carry out the method according to one of the preceding claims.

The removable battery pack has a measuring amplifier, the input side of which is connected to the third electrical contact, designed as a signal or data contact, of the first interface and the output side of which is connected to the first monitoring unit. Furthermore, the removable battery pack can have a resistor element, the one side of which is connected to the third electrical contact, designed as a signal or data contact, and the other side of which is connected to the second electrical contact, designed as an energy supply contact, of the first interface. The resistor element is particularly advantageously designed as a coding resistor for identifying the removable battery pack in the electrical consumer. Therefore, a further resistor element does not have to be installed in the removable battery pack. In addition, the value of the coding resistance is already known to the further monitoring unit of the electrical consumer.

In an alternative configuration, the third electrical contact, designed as a signal or data contact, of the first interface can also be connected via a simple filter circuit, for example a diode, or directly to the first monitoring unit.

The measuring amplifier of the removable battery pack can be controlled by the first monitoring unit of the removable battery pack. In this way, a possibly necessary adjustment to the measuring range of the first monitoring unit is possible in order to interpret and to evaluate lower measured voltage values than actually higher voltage values.

Another configuration of the system according to the disclosure makes provision for the first current measuring apparatus of the electrical device to have a first current measuring amplifier, the input side of which is connected to a first current sensor connected to the second electrical contact, designed as an energy supply contact, of the further interface and the output side of which is connected via a pull-up resistor to the third electrical contact, designed as a signal or data contact, of the further interface.

Provision is particularly advantageously further made for the first monitoring unit of the removable battery pack to evaluate the charging or discharge current calculated based on the resistance values of the resistor element and the pull-up resistor that are known to the monitoring unit and the current-voltage transmission function of the first current measuring apparatus of the electrical device as permissible or impermissible. This results in the advantages already depicted in connection with the method according to the disclosure.

In addition, the electrical device has a second current measuring apparatus for measuring the charging or discharge current by means of a second current sensor, which is connected in series with the first current sensor of the first current measuring apparatus. The first and the second current sensor can be designed as a shunt resistor, a Hall sensor, a magnetic field sensor, a DC-isolated current clamp or the like. The second current measuring apparatus of the electrical device has a second current measuring amplifier, by means of which said second current measuring apparatus is connected to the further monitoring unit. The first monitoring unit of the removable battery pack transmits the charging or discharge current calculated by said monitoring unit via fourth electrical contacts, designed as signal or data contacts, of the interfaces to the further monitoring unit of the electrical device, wherein the further monitoring unit compares the calculated and measured charging or discharge current with one another. This particularly advantageously results in the plausibility check of the charging or discharge currents already depicted in connection with the method according to the disclosure.

BRIEF DESCRIPTION OF THE DRAWINGS

The disclosure is explained by way of example in the following text based on the figures, wherein identical reference signs in the figures indicate identical component parts with an identical function.

In the drawings.

DETAILED DESCRIPTION

Figure 1:
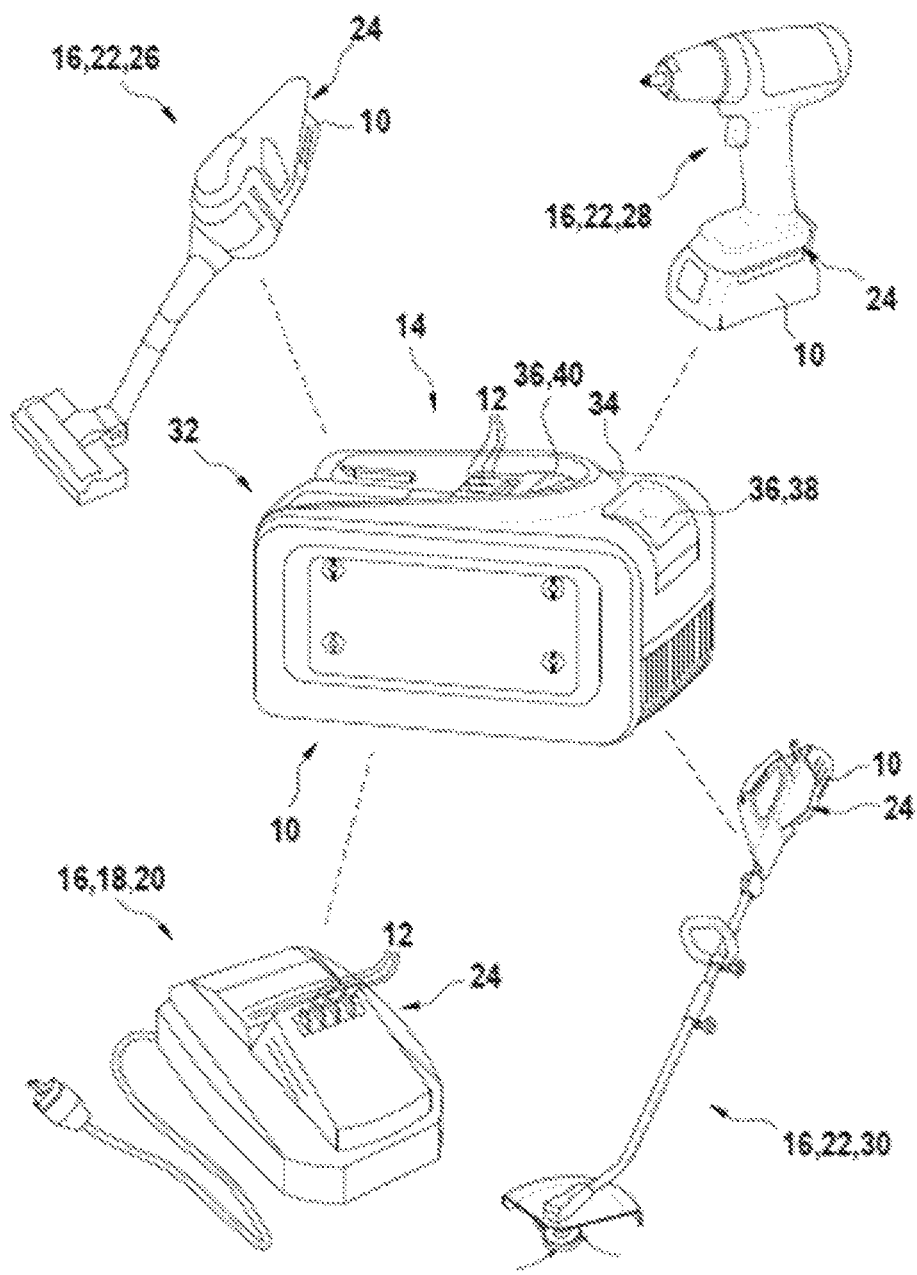
FIG. 1: shows a schematic illustration of a system comprising at least one removable battery pack and at least one electrical device that can be connected to the removable battery pack for charging or discharging the removable battery pack.

FIG. 1 shows a system comprising a removable battery pack 10 having a first electromechanical interface 14 having a plurality of electrical contacts 12 and an electrical device 16, in particular a charging device 18, a diagnostic device 20 or an electrical consumer 22, having a further electromechanical interface 24 having a plurality of electrical contacts 12. FIG. 1 is intended to illustrate that the system according to the disclosure is suitable for various electrical devices 16 operated using removable battery packs 10 without restricting the disclosure. In this case, a cordless vacuum cleaner 26, a cordless impact wrench 28 and a cordless lawn trimmer 30 are shown by way of example. In the context of the disclosure, however, a wide variety of power tools, gardening appliances and domestic appliances can be considered as electrical consumers 22. The number of removable battery packs 10 within the system can also be changed. The system can indeed also comprise several removable battery packs 10. It should furthermore be noted that, although in FIG. 1 the charging device 18 and the diagnostic device 20 are illustrated as one and the same electric device 16 because a charging device 18 can indeed also have a diagnostic function, it is conceivable, without restricting the disclosure, that the diagnostic device 20 does not have a charging function but serves only for pure diagnostics of the removable battery pack 10 for electrical fault states.

The removable battery pack 10 is essentially a conventional removable battery pack having a housing 32, which has on a first side wall or the top side 34 thereof the first electromechanical interface 14 for releasable connection to the electromechanical interface 24 of the electrical device 16. In connection with the electrical consumer 22, the first and the further electromechanical interface 14, 24 primarily serve to discharge the removable battery pack 10 while, in connection with the charging device 18, it serves to charge and, in connection with the diagnostic device 20, it serves for fault diagnosis of the removable battery pack 10. The precise configuration of the first and the further electromechanical interface 14, 24 is dependent on different factors, such as the voltage class of the removable battery pack 10 or the electrical device 16 and various manufacturer specifications, for example. It is thus possible to provide, for example, three or more electrical contacts 12 for energy and/or data transmission between the removable battery pack 10 and the electrical device 16. Mechanical coding is also conceivable, such that the removable battery pack 10 can be operated only at specific electrical devices 16. Since the mechanical configuration of the first electromechanical interface 14 of the removable battery pack and the further electromechanical interface 24 of the electrical device 16 is insignificant for the disclosure, this will not be dealt with in more detail here. Both the person skilled in the art and an operator of the removable battery pack 14 and the electrical device 16 will make the suitable selection in this regard.

The removable battery pack 10 has a mechanical arresting apparatus 36 for arresting the form-fitting and/or force-fitting detachable connection of the first electromechanical interface 14 of the removable battery pack 10 at the corresponding mating interface 24 (not shown in detail) of the electrical consumer 22. In this case, the arresting apparatus 36 is designed as a sprung pushbutton 38, which is operatively connected to an arresting member 40 of the removable battery pack 10. Due to the suspension of the pushbutton 38 and/or the arresting member 40, the arresting apparatus 36 automatically latches into the mating interface 24 of the electrical consumer 22 when the removable battery pack 10 is inserted. If an operator presses the pushbutton 38 in the insertion direction, the arresting system is released and the operator can remove or eject the removable battery pack 10 from the electrical consumer 22 counter to the insertion direction.

As already mentioned at the beginning, the battery voltage of the removable battery pack 10 usually results from a multiple of the individual voltages of the energy storage cells (not shown) depending on the interconnection (in parallel or in series) thereof. The battery cells are preferably designed as lithium-based energy storage cells, for example Li-ion, Li-Po, Li-metal and the like. However, the disclosure can also be applied to removable battery packs with Ni—Cd, Ni-MH cells or other suitable cell types.

Figure 2:
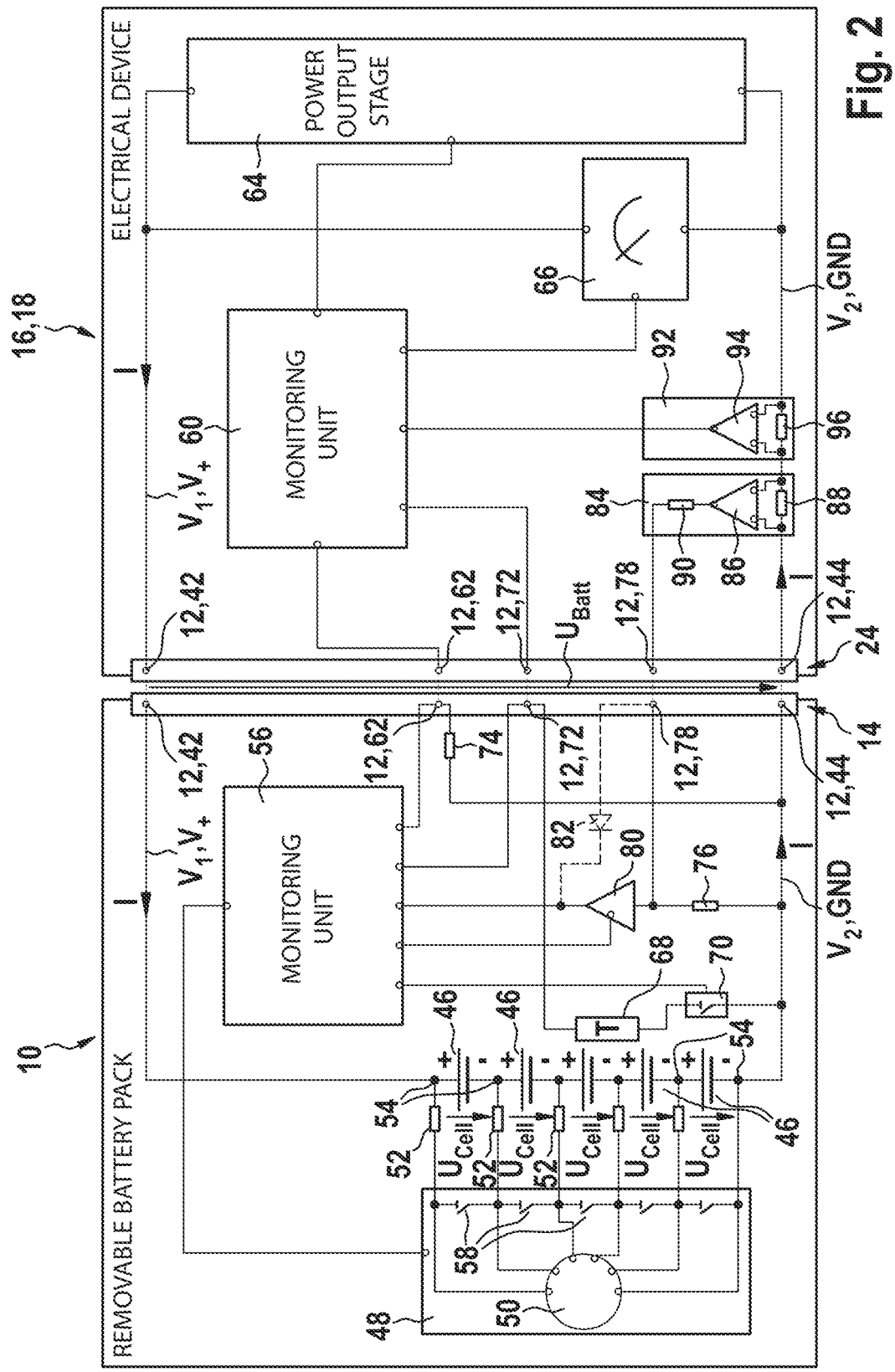
FIG. 2: shows the system from FIG. 1 as a block diagram with a removable battery pack and an electrical device designed as a charging device.

In FIG. 2, the system from FIG. 1 is illustrated in a block diagram with the removable battery pack 10 on the left-hand side and the electrical device 16 designed as a charging device 18 on the right-hand side. The removable battery pack 10 and the charging device 18 have the mutually corresponding electromechanical interfaces 14 and 24 having a plurality of electrical contacts 12, wherein in each case a first of the electrical contacts 12 of the interfaces 14, 24 serves as an energy supply contact 42 that can be supplied with a first reference potential $V_1$, preferably a supply potential $V_+$, and in each case a second of the electrical contacts 12 of the interfaces 14, 24 serves as an energy supply contact 44 that can be supplied with a second reference potential $V_2$, preferably a ground potential GND. On the one hand, the removable battery pack 10 can be charged by the charging device 18 via the first and the second energy supply contact 42, 44. On the other hand, discharge of the removable battery pack 10 is also effected via the same for the case that the electrical device 16 is designed as an electrical consumer 22. The term "can be supplied with" is intended to illustrate that the potentials $V_+$ and GND, in particular in the case of an electrical device 16 designed as an electrical consumer 22, are not permanently applied to the energy supply contacts 42, 44 but only after connection of the electrical interfaces 14, 24. The same applies for a discharged removable battery pack 10 after connection to the charging device 18.

The removable battery pack 10 has a plurality of energy storage cells 46, which, although they are illustrated in FIG. 2 as a series circuit, they can alternatively or additionally also be operated in a parallel circuit, wherein the series circuit defines the voltage $U_{Batt}$ of the removable battery pack dropped across the energy supply contacts 42, 44, whereas a parallel circuit of individual energy storage cells 46 primarily increases the capacity of the removable battery pack 10. As already mentioned, individual cell clusters consisting of parallel-interconnected energy storage cells 46 can also be connected in series in order to achieve a specific voltage $U_{Batt}$ of the removable battery pack at the same time as an increased capacity. In current Li-ion energy storage cells 46 with a cell voltage $U_{Cell}$ of in each case 3.6 V, in the present exemplary embodiment a removable battery pack voltage $U_{Batt}=V_1-V_2$ of 5·3.6 V=18 V drops across the energy supply contacts 42, 44. Depending on the number of energy storage cells 46 connected in parallel in a cell cluster, the capacity of current removable battery packs 10 can be up to 12 Ah or more. However, the disclosure is not dependent on the type, design, voltage, current-carrying ability, etc. of the energy storage cells 46 used, but instead can be applied to any removable battery packs 10 and energy storage cells 46.

To monitor the individual series-connected energy storage cells 46 or cell clusters of the removable battery pack 10, an SCM (single cell monitoring) preliminary stage 48 is provided. The SCM preliminary stage 48 has a multiplexer measuring apparatus 50, which can be connected in a high-impedance manner to corresponding taps 54 of the poles of the energy storage cells 46 or cell clusters via filter resistors 52. To detect the individual cell voltages $U_{Cell}$, the multiplexer measuring apparatus 50 switches over sequentially between the individual taps 54, for example by means of integrated transistors, which are not shown in more detail, in such a way that it is connected in each case to a positive and a negative pole of the energy storage cell 46 to be measured or the cell cluster to be measured. In the following text, the term energy storage cell is also intended to include the cell cluster, since these only influence the capacity of the removable battery pack 10, but are synonymous for detecting the cell voltages $U_{Cell}$. The filter resistors 52, which are configured, in particular, in a high-impedance manner, can prevent dangerous heating of the measuring inputs of the multiplexer measuring apparatus 50, in particular in the event of a fault.

The switchover of the multiplexer measuring apparatus 50 is effected by means of a first monitoring unit 56 integrated in the removable battery pack 10. Said monitoring unit can additionally close or open switching elements 58 of the SCM preliminary stage 48 that are connected in parallel with the energy storage cells 46 in order to effect what is known as balancing of the energy storage cells 46 to achieve uniform charging and discharging states of the individual energy storage cells 46. It is likewise conceivable that the SCM preliminary stage 48 passes the measured cell voltages $U_{Cell}$ directly through to the first monitoring unit 56 such that the actual measurement of the cell voltages $U_{Cell}$ is carried out directly by the first monitoring unit 56, for example by means of an appropriate analog-to-digital converter (ADC).

The first monitoring unit 56 can be designed as an integrated circuit in the form of a microprocessor, ASIC, DSP or the like. However, it is also likewise conceivable that the monitoring unit 56 consists of a plurality of microprocessors or at least partly of discrete components with appropriate transistor logic. In addition, the first monitoring unit 56 can have a memory for storing operating parameters of the removable battery pack 10, such as, for example, the voltage $U_{Batt}$, the cell voltages $U_{Cell}$, a temperature T, a charging or discharge current I or the like.

In addition to the first monitoring unit 56 in the removable battery pack 10, the electrical device 16 of the system has a further monitoring unit 60, which can be designed correspondingly to the first monitoring unit 56. The first and the further monitoring unit 56 and 60, respectively, can exchange information, preferably digitally, via a further contact 12, designed as a signal or data contact 62, of the two electromechanical interfaces 14, 24.

The further monitoring unit 60 of the electrical device 16 designed as a charging device 18 controls a power output stage 64, which is connected to the first and the second energy supply contact 42, 44 of the further interface 24 and by means of which the removable battery pack 10 plugged into the charging device 18 can be charged using the charging current I and the voltage $U_{Batt}$ corresponding to the removable battery pack 10. For this purpose, the charging device 18 or the power output stage 64 is provided with a mains connection, which is not shown. The voltage $U_{Batt}$ applied to the energy supply contacts 42, 44 can be measured by means of a voltage measuring apparatus 66 in the charging device 18 and evaluated by the further monitoring unit 60. The voltage measuring apparatus 66 can also be integrated fully or partly in the monitoring unit 60, for example in the form of an integrated ADC.

A temperature T of the removable battery pack 10 or the energy storage cells 46 can be measured by means of a temperature sensor 68, which is arranged in the removable battery pack 10 and preferably designed as an NTC and in close thermal contact with at least one of the energy storage cells 46, and evaluated by the further monitoring unit 60 of the charging device 18. To this end, the temperature sensor 68 is connected on one side to the second reference potential $V_2$, in particular to the ground potential GND, which is applied to the second energy supply contact 44 via a switching element 70, for example a bipolar transistor or MOSFET, which is integrated in the removable battery pack 10, and on the other side to a contact 12, designed as a signal or data contact 72, of the first interface 14 of the removable battery pack 10. A signal or data contact 72 is accordingly provided in the further interface 24 of the charging device 18, said contact being connected to the further monitoring unit 60. Furthermore, a connection exists between the signal or data contact 72 of the first interface 14 of the removable battery pack 10 and the first monitoring unit 56 of the removable battery pack 10. Via said connection, the first monitoring unit 56 can determine whether the temperature T measured by the temperature sensor 68 has been requested by the further monitoring unit 60 of the charging device 18. If this is the case, the first monitoring unit 56 is transferred automatically from a quiescent mode to an operating mode. If there has been no such request, the quiescent mode allows the first monitoring unit 56 significantly longer idle and storage times of the removable battery pack 10 due to the reduced quiescent current.

In order that the charging device 18 can identify the removable battery pack 10 and, if necessary, enable it for charging, the removable battery pack 10 has a first coding resistor 74, which is connected on one side to the second reference potential $V_2$, in particular to the ground potential GND, which is applied to the second energy supply contact 44 and on the other side to the contact 12, designed as a signal or data contact 62, of the first interface 14 of the removable battery pack 10. If the resistance value of the first coding resistor 74 corresponds to a value stored in the further monitoring unit 56 of the charging device 60, the charging device 18 enables the charging process and charges the removable battery pack 10 according to the charging parameters stored in a look-up table, in particular the charging current I, the charging voltage $U_{Batt}$, the permissible temperature range, etc. In addition to the first coding resistor 74, a second coding resistor 76 is provided in the removable battery pack 10, said second coding resistor being connected, in a manner corresponding to the first coding resistor 74, to the second reference potential $V_2$ and a further contact 12, designed as a signal or data contact 78, of the first interface 14 of the removable battery pack 10. An electrical device 16 designed as an electrical consumer 22 can enable the discharge process of the removable battery pack 10 by means of the second coding resistor 76. To this end, analogously to the charging device 18, the electrical consumer 22 has a further monitoring unit 60, which requests the resistance value of the second coding resistor 76 by means of a contact 12, designed as a signal or data contact 78, of the further interface 24 and compares it with a stored value. If the values do not correspond, the discharging process of the removable battery pack 10 is terminated or not permitted, with the result that the electrical consumer 22 cannot be set into operation. When they correspond, an operator can set the electrical consumer 22 into operation. This particularly advantageously allows operation of removable battery packs 10 of different power classes with identical electromechanical interfaces 14 or 24. It is self-evident that, in the case of an electrical consumer 22, the power output stage 64 contained in the charging device 18 is designed as a drive unit, for example as an electric motor (possibly with power output stage accordingly connected upstream) or another unit that consumes energy. The configuration of such a unit will not be dealt with further here since it is well known to a person skilled in the art for a wide variety of types of electrical consumers 22 and also does not have any critical importance for the disclosure.

The removable battery pack 10 has a measuring amplifier 80, the input side of which is connected between the further electrical contact 12, designed as a signal or data contact 78, of the first interface 14 and the second coding resistor 76. The output side of the measuring amplifier 80 is connected to the first monitoring unit 56 of the removable battery pack 10. The amplification of the measuring amplifier 80 can be adjusted where necessary by the first monitoring unit 56 via a corresponding control line. As an alternative, it is also conceivable that the second coding resistor 76 is connected to the first monitoring unit 56 directly or via a filter circuit 82, for example a protective diode. This option is illustrated in FIG. 2 using dashes.

The charging device 18 has a first current measuring apparatus 84 having a first current measuring amplifier 86, the input side of which is connected to a first current sensor 88 connected to the second energy supply contact 44 of the further interface 24 and the output side of which is connected to the signal or data contact 78 of the further interface 24 via a pull-up resistor 90. The first current sensor 88 can be designed, for example, as a shunt resistor, a Hall sensor, a magnetic field sensor, a DC-isolated current clamp or the like. The first current measuring amplifier 86 can be designed as a microcontroller, an op amp, a corresponding discrete circuit or the like. A potential resulting from the second coding resistor 76 of the removable battery pack 10, the pull-up resistor 90 in the charging device 18 and the charging current I is therefore produced at the signal or data contact 78.

In addition to the first current measuring apparatus 84, a second current measuring apparatus 92 is provided in the charging device 18 for measuring the charging current I by means of a second current measuring amplifier 94 and a second current sensor 96, which is connected in series with the first current sensor 88 of the first current measuring apparatus 84. For this purpose, the second current measuring apparatus 92 is connected to the further monitoring unit 60 of the charging device 18. As an alternative, it is also possible to connect the second current sensor 96 to the further monitoring unit 60 directly or via a filter circuit, for example in the form of an interconnected protective diode, provided said monitoring unit has a corresponding ADC. This option is not illustrated in FIG. 2 for reasons of clarity. The second current sensor 96 and the second current measuring amplifier 94 can be designed correspondingly to the first current sensor 88 and the first current measuring amplifier 86.

The resistance values of the second coding resistor 76 and the pull-up resistor 90 are known to the first monitoring unit 56 of the removable battery pack 10 as fixed values. It likewise knows the transmission function of the first current measuring apparatus 84 of the charging device 18.

Based on these parameters, the first monitoring unit 56 can calculate the charging current I and evaluate whether this is suitable for the removable battery pack 10. The first monitoring unit 56 now transmits the charging current I calculated thereby or a correspondingly converted voltage value $U_{Charge}$ via the signal or data contacts 62 of the interfaces 14, 24 to the further monitoring unit 60 of the charging device 18, with the result that the further monitoring unit 60 can compare the charging current I calculated in the removable battery pack 10 and the charging current I measured in the charging device 18 with one another in order to evaluate whether the removable battery pack 10 is operating in a permissible operating range.

The charging process is finally terminated or reduced by the further monitoring unit 60 of the charging device 18 and/or a fault state of the removable battery pack 10 is signaled when the calculated and the measured charging current I deviate from one another by a defined difference value $I_{Diff}$, for example by more than 0.5 A.

According to FIGS. 3*a*, 3*b*, 3*c*, and 3*d*, at least one impermissible voltage range 98 and at least one permissible voltage range 100 for the measured charging current I is defined for the first current measuring apparatus 84 of the charging device 18, wherein a linear, non-linear or discontinuous current-voltage transmission function 102 is provided in the at least one permissible voltage range 100. In this case, the transmission function 102 of the second current measuring amplifier 94 is advantageously selected in such a way that a plausibility check of the output signal is possible using the output signal supplied by the first current measuring amplifier 86.

Figure 3A:
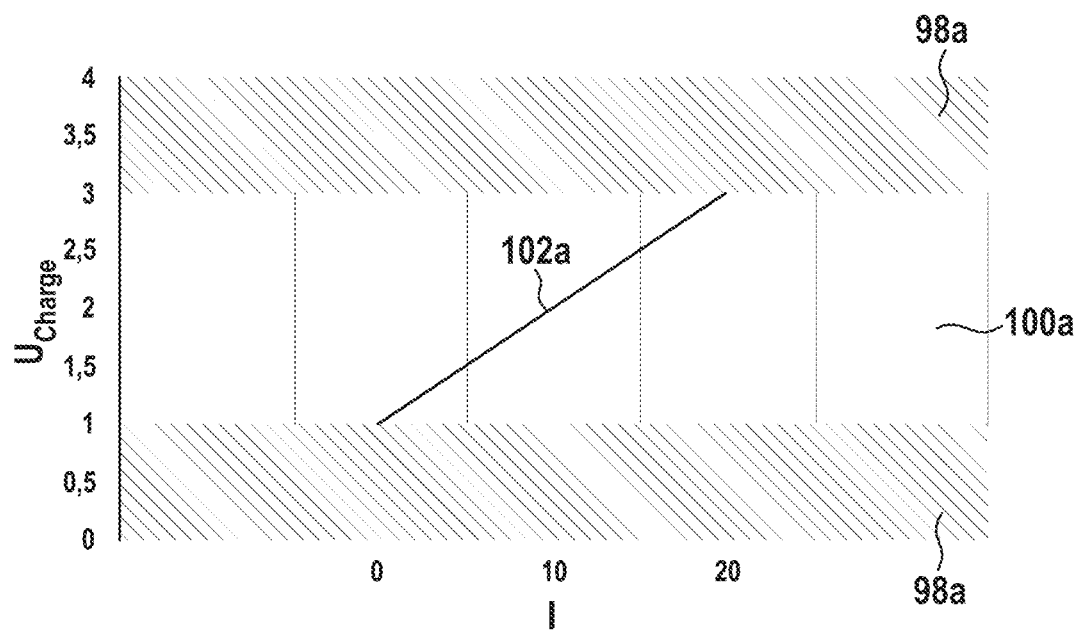
FIG. 3a: shows a first exemplary embodiment of a transmission function of at least one current measuring apparatus integrated in the electrical device.

A first possible transmission function 102*a* for the first current measuring apparatus 84 is shown in FIG. 3*a*. Accordingly, two impermissible voltage ranges 98*a* are defined for $U_{Charge}$=0 to 1 V and $U_{Charge}$>3 V, whereas the permissible voltage range 100*a* results for 1 V<=$U_{Charge}$<=3V. In the permissible voltage range 100*a*, the voltage $U_{Charge}$ represents a charging current I of 10 A/V with the linear transmission function 102*a*

$$I=10 \text{ A}*(U_{Charge}-1 \text{ V})/\text{V}.$$

Figure 3B:
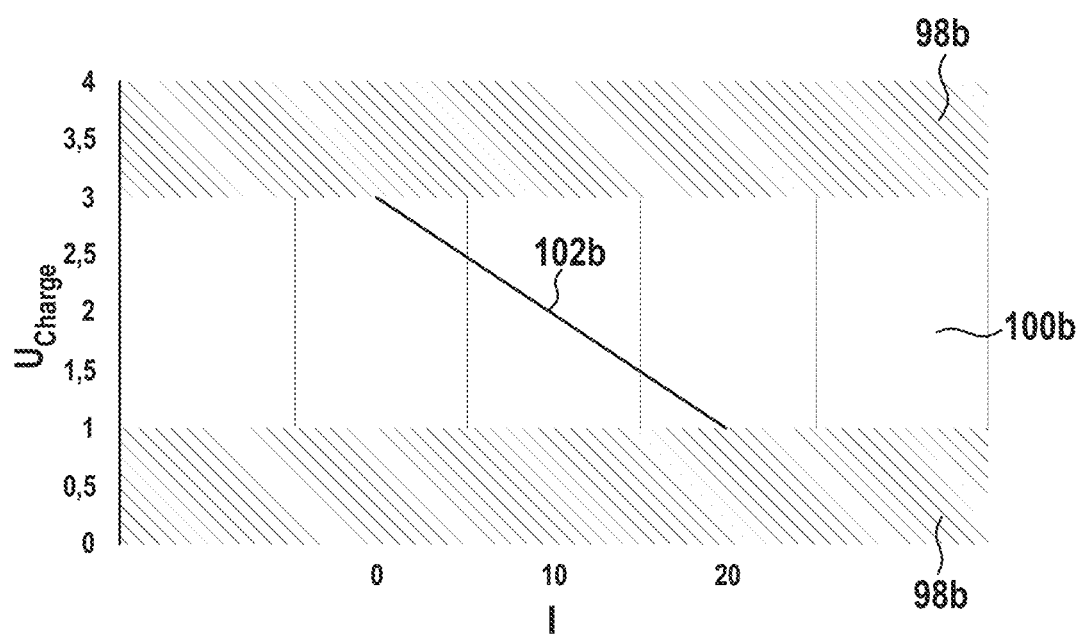
FIG. 3b: shows a second exemplary embodiment of a transmission function of at least one current measuring apparatus integrated in the electrical device.

A further transmission function 102*b* is shown in FIG. 3*b*, wherein the impermissible voltage ranges 98*b* and the permissible voltage range 100*b* correspond to those of FIG. 3*a*. The transmission function 102*b* now has a negative gradient with $$I=-10 \text{ A}*(U_{Charge}-3 \text{ V})/\text{V}.$$

Therefore, the first monitoring unit 56 of the removable battery pack 10 can differentiate between whether a permissible output signal is present or, for example, a charging device 18 that does not have an appropriate current measuring apparatus 84, 96 is being used.

Figure 3C:
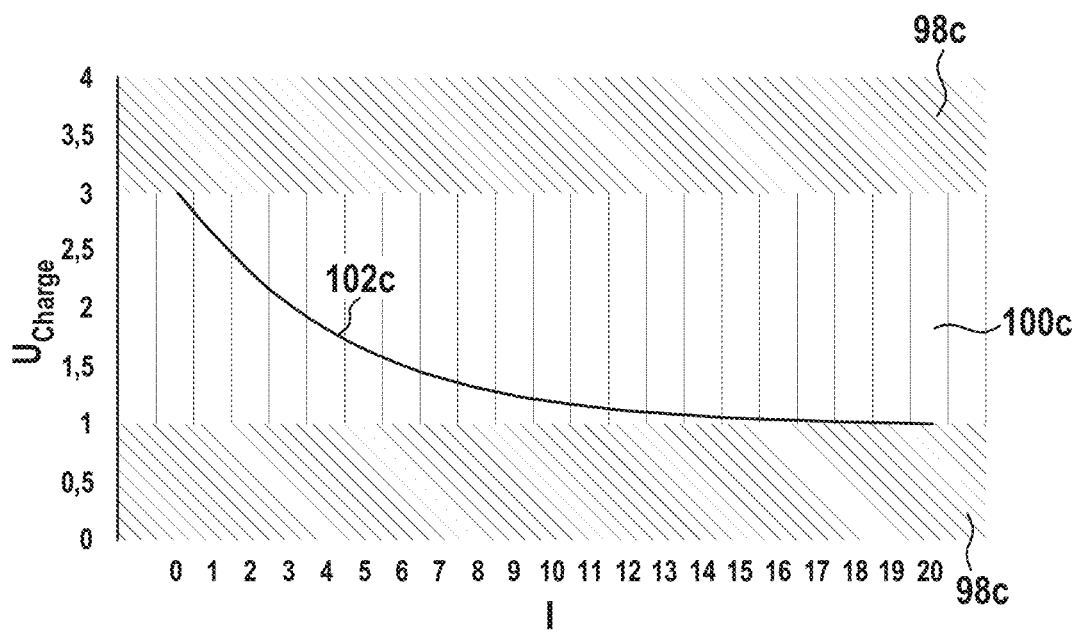
FIG. 3c: shows a third exemplary embodiment of a transmission function of at least one current measuring apparatus integrated in the electrical device.

According to FIG. 3*c*, the transmission function 102*c* can also have a non-linear, in particular logarithmic, profile. Therefore, the first monitoring unit 56 identifies, for example, a jump of $U_{Charge}$=1 V to $U_{Charge}$=1.1 V as a change of the charging current I of 7 A, whereas a jump of $U_{Charge}$=2.9 V to $U_{Charge}$=3 V is identified as a charging current change of 0.2 A. Such an illustration has the advantage that lower currents can be measured more accurately in terms of absolute value than high currents.

Figure 3D:
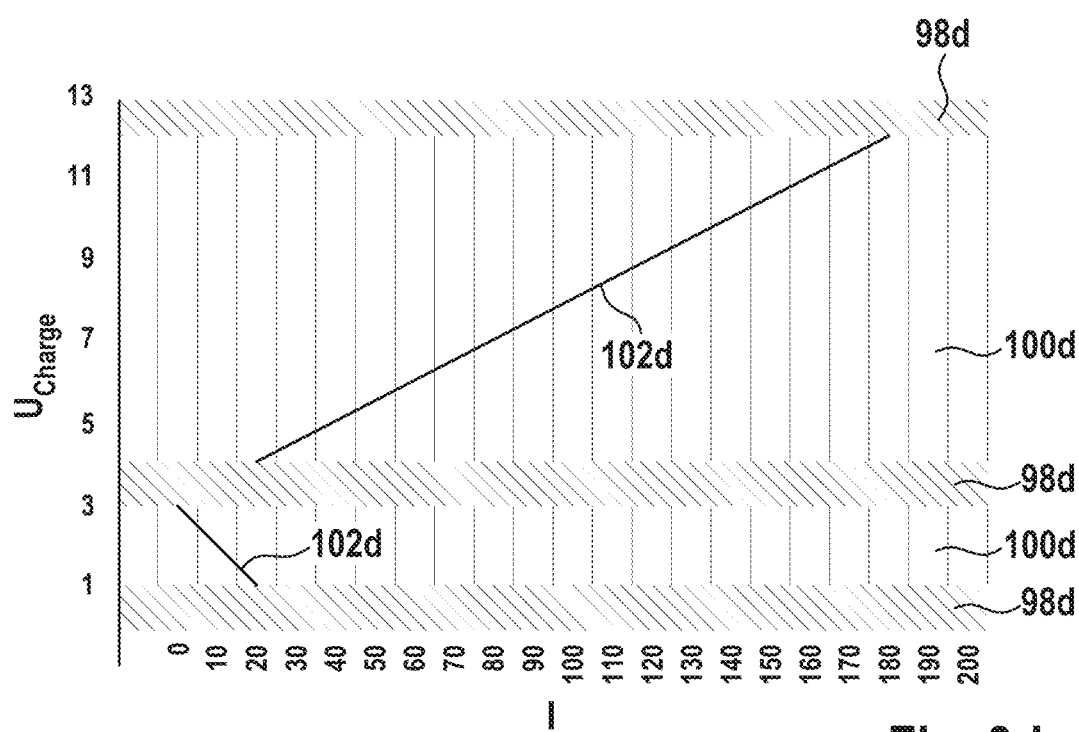
FIG. 3d: shows a fourth exemplary embodiment of a transmission function of at least one current measuring apparatus integrated in the electrical device.

In a further configuration of the disclosure, the transmission function 102*d* can also have jump discontinuities according to FIG. 3*d*. In this case, a first partial transmission function 102*d* including the associated impermissible and permissible voltage ranges 98*d* and 100*d*, respectively, correspond to those from FIG. 3*b*, whereas, in a second permissible voltage range 100*d* of 4 V<=$U_{Charge}$<=12V, a gradient of 10 A/V with a second linear partial transmission function 102*d*

$$I=20 \text{ A}*(U_{Charge}-3 \text{ V})/\text{V}$$

is defined, that is to say a charging current of 20 to 180 A can be depicted in this range.

It is likewise conceivable that the gradient of the second partial transmission function 100*d* deviates from that of the first partial transmission function 100*d*. Both gradients can also be positive or negative. The particular advantage consists in that a removable battery pack 10 for which only a charging current I in the first permissible voltage range 100*d* is relevant does not have to have a measuring amplifier 80 that is capable of covering the second permissible voltage range 100*d*. If a voltage value $U_{Charge}$ outside of the first permissible voltage range 100*d* were transmitted from the further monitoring unit 60 of the charging device 18, the first monitoring unit 56 of the removable battery pack 10 identifies this anyway as impermissible. That is to say, the first monitoring unit 56 of such a removable battery pack 10 does not have to identify, for example, a voltage value of $U_{Charge}$ of 5 V according to I=40 A, because voltage values $U_{Charge}$>3 V are impermissible for it anyway. Therefore, it is possible to design the system on the one hand to be as simple as possible but on the other hand nevertheless to be future-proof.

The first monitoring unit 56 of the removable battery pack can adjust the measuring amplifier 80 for amplifying the measured charging current I or the voltage value $U_{Charge}$ derived therefrom in such a way that, in the case of an applied voltage $U_{Charge}$ outside of the measuring range, a voltage $U_{Charge}$ within the measuring range is produced. Since the first monitoring unit 56 itself has knowledge about this switchover, it can interpret and evaluate the now lower measured voltage $U_{Charge}$ as an actually higher voltage.

To display the detected fault states, the charging device 18 and/or the removable battery pack 10 have a corresponding display, not shown in more detail, in the form of an LED, a display screen and/or an acoustic signal generator. If the electrical device 18 is designed as a diagnostic device 20 or an electrical consumer 22, the display can additionally or alternatively also be designed as a haptic signal generator, for example in the form of a vibration motor. In the case of an electrical consumer 22 driven by electric motor, it is also conceivable that a drive motor for an insert tool serves as haptic and/or acoustic signal generator.

Finally, it should be pointed out that the exemplary embodiments shown are not restricted either to the figures nor to the number and type of removable battery packs 10 and electrical devices 16 shown therein. The same applies to the number of energy storage cells 46 and the associated configuration of the multiplexer measuring apparatus 48. In addition, the configurations of the interfaces 14, 24 and the number of contacts 12 thereof and the transmission functions with the specified current and voltage values shown are to be understood as purely exemplary.

What is claimed is:

1. A method for detecting electrical fault states of a removable battery pack and/or an electrical device that can be connected to the removable battery pack, comprising:

measuring a charging current value of a charging current using a first current measuring apparatus integrated in the electrical device, the charging current generated by the electrical device for charging the removable battery pack;

transmitting the measured current value directly or as a converted voltage value to a first monitoring unit of the removable battery pack, the first monitoring unit integrated in a housing of the removable battery pack;

determining, using the first monitoring unit, based on the transmitted current value and/or the converted voltage value, whether the removable battery pack is operating in a permissible operating range; and terminating or reducing a charging or discharging process of the removable battery pack using a second monitoring unit integrated in the electrical device and signaling a fault state of the removable battery pack using a display mounted on the removable battery pack when the removable battery pack is operating outside of the permissible operating range, wherein the removable battery pack is configured to generate a discharge current, and wherein the first current measuring apparatus does not carry the discharge current.

2. The method according to claim 1, further comprising: defining at least one impermissible voltage range and at least one permissible voltage range for the measured current value and/or the converted voltage value, wherein the at least one permissible voltage range is defined by a linear, non-linear, or discontinuous current-voltage transmission function.

3. The method according to claim 1, wherein:
the discharge current is up to 250 amps, and
the charging current is 16 amps or less.

4. The method according to claim 1, further comprising:
transmitting the measured current value to the second monitoring unit;
measuring another charging current value using a second current measuring apparatus of the electrical device; and
comparing the measured current value from the first current measuring apparatus to the measured current value from the second current measuring apparatus using the second monitoring unit.

5. The method according to claim 4, further comprising:
terminating or reducing the charging process using the second monitoring unit and/or signaling the fault state of the removable battery pack when the measured current value from the first current measuring apparatus and the measured current value from the second current measuring apparatus deviate from one another by at least a defined difference value.

6. A method for detecting electrical fault states of a removable battery pack and/or an electrical device that can be connected to the removable battery pack, comprising:
measuring a charging or discharge current value using a first current measuring apparatus integrated in the electrical device;
transmitting the measured current value as a converted voltage value to a first monitoring unit of the removable battery pack, the first monitoring unit integrated in the removable battery pack;
determining, using the first monitoring unit, based on the transmitted converted voltage value, whether the removable battery pack is operating in a permissible operating range;
terminating or reducing a charging or discharging process of the removable battery pack using a second monitoring unit integrated in the electrical device and signaling a fault state of the removable battery pack using a display of the removable battery pack when the removable battery pack is operating outside of the permissible operating range; and
adjusting an amplifier circuit integrated in the removable battery pack, using the first monitoring unit, to amplify the converted voltage value, such that when the converted voltage value is outside of a corresponding measurement range, an amplified voltage value within the measurement range is generated by the amplifier circuit.

7. A system comprising:
a removable battery pack including a first monitoring unit, a measuring amplifier, and a first electromechanical interface having a first plurality of electrical contacts; and
an electrical device including a second monitoring unit, a first current measuring apparatus, and a second electromechanical interface having a second plurality of electrical contacts,
wherein in each of the first and second plurality of electrical contacts (i) a first electrical contact is configured as an energy supply contact that can be supplied with a first reference potential, (ii) a second electrical contact is configured as an energy supply contact that can be supplied with a second reference potential, and (iii) at least one third electrical contact is configured as a signal or data contact for transmitting a charging or discharge current value measured using the first current measuring apparatus or a converted voltage value derived from the charging or discharge current value to the first monitoring unit,
wherein the system is configured to detect electrical fault states of the removable battery pack and/or the electrical device, the system configured to:
transmit the converted voltage value to the first monitoring unit; and
determine, using the first monitoring unit, based on the transmitted converted voltage value, whether the removable battery pack is operating in a permissible operating range,
wherein the measuring amplifier has an input side and an output side,
wherein the input side is connected to the at least one third electrical contact, configured as the signal or data contact, of the first electromechanical interface,
wherein the output side is connected to the first monitoring unit, and
wherein the first monitoring unit is configured to adjust an amplification of the measuring amplifier of the removable battery pack to amplify the converted voltage value, such that when the converted voltage value is outside of a corresponding measurement range, an amplified voltage value within the measurement range is generated by the measuring amplifier.

8. The system according to claim 7, further comprising:
a filter circuit configured to connect the at least one third electrical contact, configured as the signal or data contact, of the first electromechanical interface to the first monitoring unit.

9. The system according to claim 7, wherein:
the removable battery pack includes a resistor element having a first connection side and a second connection side,
the first connection side is connected to the at least one third electrical contact, configured as the signal or data contact, of the first electromechanical interface, and
the second connection side is connected to the second electrical contact, configured as the energy supply contact, of the first electromechanical interface.

10. The system according to claim 9, wherein the resistor element is a coding resistor configured to identify the removable battery pack in an electrical consumer.

11. The system according to claim 9, wherein:
the first current measuring apparatus includes a first current measuring amplifier having an input side and an output side, the input side is connected to a first current sensor connected to the second electrical contact, configured as the energy supply contact, of the second electromechanical interface, and the output side is connected by a pull-up resistor to the at least one third electrical contact, configured as the signal or data contact, of the second electromechanical interface.

12. The system according to claim 11, wherein:

the electrical device includes a second current measuring apparatus configured to measure the charging current using a second current sensor, and the second current sensor is connected in series with the first current sensor of the first current measuring apparatus.

13. The system according to claim 11, wherein the first monitoring unit is configured to evaluate another charging current value calculated based on resistance values of the resistor element and the pull-up resistor that are known to the first monitoring unit and a current-voltage transmission function of the first current measuring apparatus as permissible or impermissible.

14. The system according to claim 13, wherein:

the first monitoring unit is configured to transmit the charging current value via the at least one third electrical contact, of the first electromechanical interface and the second electromechanical interface, to the second monitoring unit, and the second monitoring unit is configured to compare the calculated and measured charging or discharge currents with one another.

\* \* \* \* \*